United States Patent [19]

Ezaki

[11] Patent Number: 5,256,836
[45] Date of Patent: Oct. 26, 1993

[54] THICK FILM HYBRID CIRCUIT BOARD DEVICE AND METHOD OF MANUFACTURING THE SAME

[75] Inventor: Shiro Ezaki, Yokohama, Japan

[73] Assignee: Toshiba Lighting & Technology Corporation, Tokyo, Japan

[21] Appl. No.: 764,062

[22] Filed: Sep. 24, 1991

Related U.S. Application Data

[62] Division of Ser. No. 522,146, May 11, 1990, abandoned.

[30] Foreign Application Priority Data

Jun. 9, 1989 [JP] Japan ................. 1-145277

[51] Int. Cl.$^5$ .............................. H05K 1/00
[52] U.S. Cl. ...................... 174/260; 428/901; 29/844; 29/847
[58] Field of Search ............. 174/260, 261; 338/195, 338/307, 308, 309; 428/901; 29/844, 846, 847

[56] References Cited

U.S. PATENT DOCUMENTS

| | | | |
|---|---|---|---|
| 3,930,304 | 1/1976 | Keller et al. | 338/195 |
| 4,259,564 | 3/1981 | Ohkubo et al. | 338/308 |
| 4,835,038 | 5/1989 | Kaneko et al. | 428/901 |
| 4,899,126 | 2/1990 | Yamada | 338/309 |

FOREIGN PATENT DOCUMENTS 2088644A 5/1982 United Kingdom ........... 338/308

OTHER PUBLICATIONS

*IBM Disclosure Bulletin* "Thin Film Resistors on Metallized Substrates" Ameen, J. G. et al., vol. 21, No. 3, Aug. 1978.

Primary Examiner—Leo P. Picard
Assistant Examiner—Trinidad Koka
Attorney, Agent, or Firm—Oblon, Spivak, McClelland, Maier & Neustadt

[57] ABSTRACT

A thick film hybrid circuit board device is formed by laminating a first layer and a second layer on an insulative base board. The second layer being overlapped between over the insulative base board and the first layer has a recessed portion located at cross portion where peripheral edge portion of the first layer and a peripheral edge portion of the second layer are crossed. The recessed portion is formed in the shape of being recessed inwardly of the second layer. Bleedings generated from the second layer consisting of paste are held in the recessed portion, so that short circuit accidents caused by the bleedings mutually combined are effectively prevented.

2 Claims, 4 Drawing Sheets

THICK FILM HYBRID CIRCUIT BOARD DEVICE AND METHOD OF MANUFACTURING THE SAME

This application is a division of application Ser. No. 07/522,146, filed on May 11, 1990, now abandoned.

BACKGROUND OF THE INVENTION

This invention relates to a thick film hybrid circuit board device formed by utilizing screen printing process and to a method of manufacturing the same. More particularly, it relates to a thick film hybrid circuit board device having a high quality and a compact structure and also relates to a method of manufacturing thick film hybrid circuit boards of this character.

A thick film hybrid circuit board device of the conventional type has a construction which as a plurality of circuit forming materials laminated on an insulative baseboard. For example, a thick film hybrid circuit board device having a resistor element as a circuit element is manufactured by printing, e.g., screen printing a first layer as a resistor on the insulative base board and by laminating a second layer on both peripheral edge portions of the first layer as a pair of electrodes.

Resistors and electrodes are usually formed by printing circuit forming materials on a surface of the insulative base board by utilizing a screen printing process to form thick films.

The thick films printed on the base board are then fired under predetermined condition to form hardened resistors and electrodes.

In the screen printing process, a screen plate having numerous micro holes on the entire surface thereof is prepared as a printing mold. The holes are provided in an outside area of a predetermined circuit pattern formed by photomechanical processing are broken so as to be plugged.

The screen printing process is utilized as a method of forming a circuit film by squeezing a paste-like circuit forming material onto the base board through the holes provided inside the area of the circuit pattern.

The method of manufacturing the thick film hybrid circuit board device will be explained in more detail below. First, a resistive paste is screen printed on the base board to form a layer. The printed resistive paste is then fired to form a resistive layer as this first layer. Secondly, a conductive paste for forming a second layer is printed on both the upper end surfaces of the resistive layer, and the printed conductive paste is fired to form a pair of electrode layers as the second layer.

However, in this type of the conventional thick film hybrid circuit board device, stagger portions exist between the upper surface of the insulative base board and a cross portion where a peripheral edge portion of the resistive layer and that of a pair of electrode layers are mutually cross.

Due to existence of the stagger portions, a part of each of the electrode layers formed of conductive paste will spread from an internal edge portion thereof toward the other electrode layer, resulting in the formation of bleeding which move toward the other electrode layer.

For this reason, in a case where a distance between a pair of electrode layers follows as the amount of integration of the thick film hybrid circuit board device increases the distance between the two electrode layers is substantially reduced by the bleedings which comprise the paste, so that a serious problem is encountered, that is, the resistance value of the resistive layer includes significant errors.

Moreover, in a case where the amount of paste bleedings generated from the electrode layers is large, the bleedings may mutually combine to form a bridge portion, causing a short circuit to occur between the pair of electrode layers.

Furthermore, during a trimming process for adjusting a resistance of the resistive layer, it becomes more difficult to set a starting point at which the trimming operation starts because the distance between the pair of electrode layers is extremely reduced.

SUMMARY OF THE INVENTION

An object of the present invention is to substantially eliminate the defects or drawbacks encountered in the prior art described above and to provide a thick film hybrid circuit board device which has a simple construction which effectively preventing the variation in the electrical characteristics of the first layer caused by bleedings generated from a paste of the second layer and which is substantially free from short circuits may take place between the pair of second layers which are located opposite each other, and also to provide a method of manufacturing this type of circuit board device.

This and other objects can be achieved according to this invention in one aspect by providing a thick film hybrid circuit board device which comprises an insulative base board as a base plate; a first layer formed on the insulative base board; and a second layer formed so as to be overlapped with a surface of the first layer and a surface of the insulative base board, the second layer is provided with an inwardly recessed portion formed at a cross portion where a peripheral edge portion of the first layer and a peripheral edge portion of the second layer are crossed.

In another aspect of this invention, there is provided a method of manufacturing a thick film hybrid circuit board device, the method comprises the steps of: preparing an insulative base board as a base plate and at least two kinds of paste-like circuit forming materials; screen printing one paste-like circuit forming material on a surface of the insulative base board by utilizing a screen printing process to form one layer; firing the thus formed one layer to form as a first layer; screen printing another paste-like circuit forming material on surfaces of the first layer and the insulative base board by utilizing the screen printing process so as to be overlapped with the first layer and the insulative base board to form another layer having a portion recessed inwardly of the another layer in which the recessed portion is located at a cross portion where a peripheral edge portion of the first layer and a peripheral edge portion of the another layer are crossed; and firing the thus formed another layer to form as a second layer.

According to the construction of the present invention described above, when a second layer consisting of paste is screen printed by utilizing a screen printing process on an upper surface of a first layer formed on a insulative base board, a recessed portion which is recessed inwardly of the second layer is formed at a cross portion where a peripheral edge portion of the first layer and a peripheral edge portion of the second layer cross.

However, as the recessed portion of the second layer is almost completely filled up with bleedings generated from paste of the second layer, after the second layer is fired, the peripheral edge portion of the second layer is formed into almost original shape having no recessed portions.

Therefore, according to the present invention, variations in electrical characteristics of the first layer caused by bleedings generated from the second layer formed in paste and electrical short circuit caused by the bleedings mutually bonded is effectively prevented.

DESCRIPTION OF THE PREFERRED EMBODIMENTS

To better understand the preferred embodiments according to the present invention, the conventional technology will be described with reference to FIGS. 5 to 7.

A conventional thick film hybrid circuit board device is manufactured in the following manner.

Figure 5:
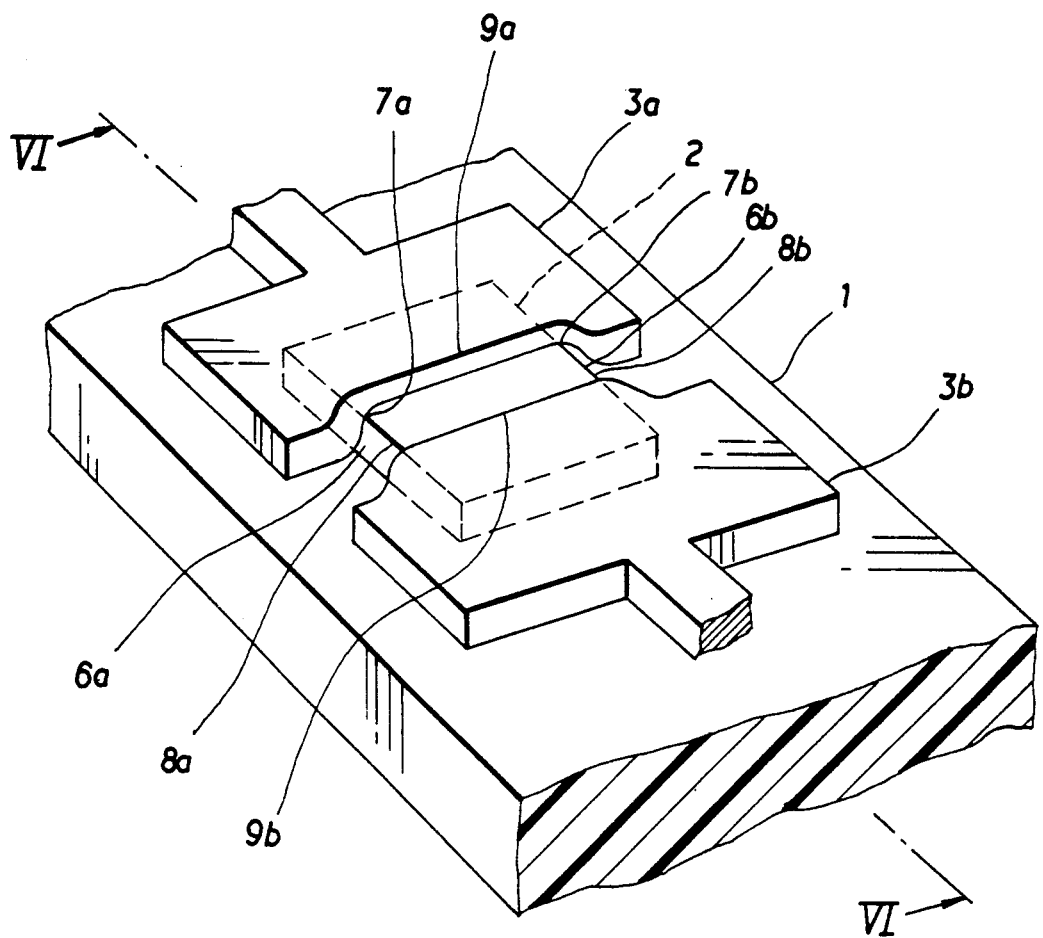
FIG. 5 is a partial perspective view showing a conventional thick film hybrid circut board device.
Figure 6:
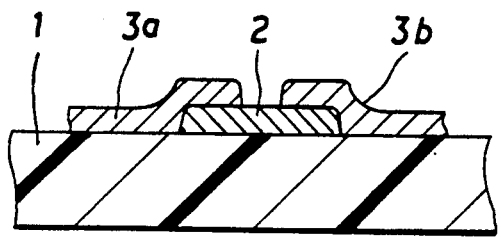
FIG. 6 is a cross-sectional view taken along the line VI—VI of FIG. 5.

Referring to FIGS. 5 and 6, and first, resistive paste containing, for example, such as ruthenium oxide ($RuO_2$) is screen printed in the shape of a rectangle on an upper surface of an insulative base board 1 made of ceramic such as alumina ($Al_2O_3$) by utilizing a screen printing process to form a layer. The layer consisting of the resistive paste is then fired at temperature of 800° to 900° C. or more preferably at about 850° C. under atmospheric pressure to form a resistive layer 2 as a first layer.

Next, a conductive paste containing conductive material such as copper(Cu), silver (Ag) or gold (Au) is screen printed in the shape of a rectangle on the upper surfaces of both right and left edges of the resistive layer 2 by utilizing a screen printing process. The conductive paste is then fired at a temperature of 500° to 700° C. more preferably at about 600° C. to form a pair of bilateral electrode layers 3a and 3b as a second layer.

However, in the conventional thick film hybrid circuit board device of the character described in conjunction with FIG. 5, stagger portions 6a and 6b exist between an upper surface of the insulative base board 1 and each of cross portions 7a and 7b where each of the peripheral edge portions 8a and 8b of the resistive layer 2 and each of the peripheral edge portions 9a and 9b of the electrode layers 3a and 3b mutually cross.

Due to the existence of these stagger portions 6a and 6b a part of one of the electrode layers 3a and 3b formed of the conductive paste will spread from the internal edge portion thereof toward the other electrode layer. Consequently, as shown in FIG. 7, bleedings 4 and 4 are caused in directions towards the mutually opposing end edge portions of the respective electrode layers 3a and 3b.

For this reason, in a case where a distance between a pair of bilateral electrode layers, 3a and 3b becomes narrower, for example, on the order of 0.254 mm as the thick film hybrid circuit board device is more miniaturized, the distance between the bilateral electrode layers 3a and 3b is substantially reduced by the bleedings, thus providing a serious problem. That is, the resistance value of the resistive layer 2 may have a significant error.

Figure 7:
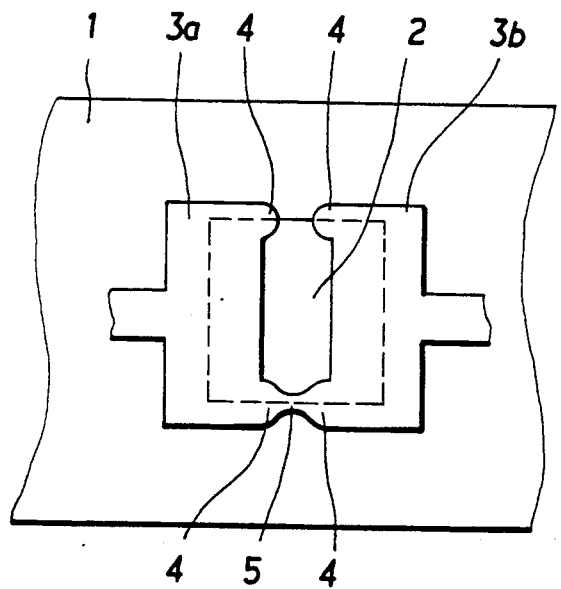
FIG. 7 is a partial plan view showing a condition where paste bleedings are generated in the conventional thick film hybrid circuit board device shown in FIG. 5.

Moreover, in the case that the paste bleedings 4 and 4 generated from the electrode layers 3a and 3b are large as shown in FIG. 7, the bleedings 4 and 4 may combine with each other to form a bridge portion 5 causing a short circuit between the pair of electrode layers 3a and 3b.

Furthermore, during the trimming process for adjusting a resistance of the resistive layer 2, it becomes more difficult to set a starting point at which trimming operation is started because the distance between the pair of electrode layers 3a and 3b is reduced.

The present invention solves the problem of the prior art described.

The inventor has eagerly studied and found that if an amount of bleedings generated from a paste of electrode layers is previously estimated and recessed portions having volumes which are equivalent to amount of the bleedings, respectively, are formed at the each of electrode layers, the bleedings are received into the recessed portions and, consequently, these recessed portions are filled up with the bleedings. The electrode layers having no outstanding bleedings are hence formed properly into the desired shape. The present invention is essentially based on these findings.

EMBODIMENTS

The embodiments in accordance with the present invention will be described below in more detail with reference to FIGS. 1 to 4.

Figure 1:
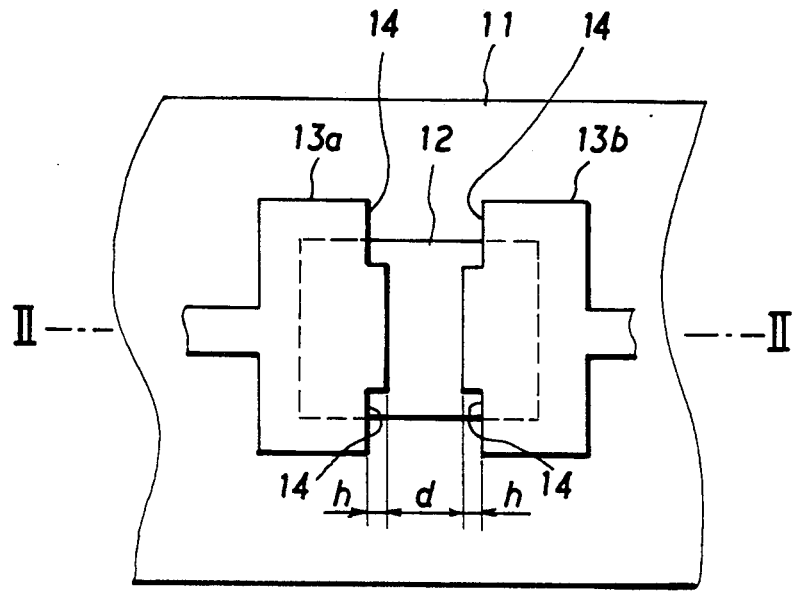
FIG. 1 is a partial plan view showing an embodiment of thick film hybrid circuit board device according to this invention.
Figure 2:
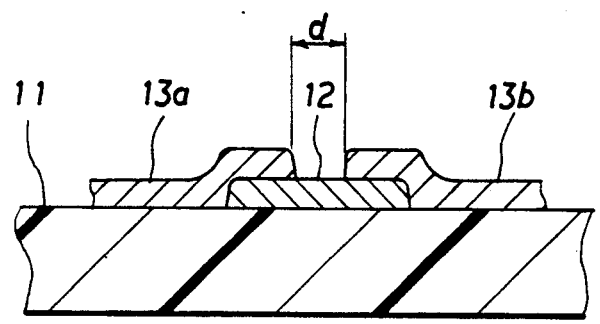
FIG. 2 is a cross-sectional view taken along the line II—II of FIG. 1.

FIG. 1 shows a partial plane view of one embodiment of a thick film hybrid circuit board device according to this invention. In FIG. 1, a resistive layer 12 as a first layer is formed on an insulative base board 11 formed of ceramic in the shape of a rectangle. At the bilateral edge portions of the resistive layer 12 as shown in FIG. 2, a pair of bilateral electrode layers 13a and 13b are formed on the resistive layer 12 as a second layer of which a peripheral portion is overlapped to the insulative base board 11. A resistance value of the resistive layer 12 can be set to a desired value by controlling a distance (d) between the bilateral layers 13a and 13b.

On the other hand, a recessed portion 14 having a rectangular shape and which is recessed inwardly of each of the electrode layers 13a and 13b is formed at each of four cross portions where peripheral edge portions (corresponding to both upper and lower side portions in FIG. 1) of the resistive layer 12 and peripheral edge portions (corresponding to both end surfaces located oppositely in FIG. 1) of the pair of electrode layers 13a and 13b are crossed.

Due to existence of stagger portions between each of the electrode layers 13a and 13b and the insulative base board 11, the bleedings in the areas marked as 4 are generated from both electrode layers consisting of paste as shown in FIG. 7 spread from one electrode layer toward the other electrode layer mutually located in the opposing condition. Therefore, an amount of volume of the bleedings 4 is previously estimated and each of the recessed portions 14 having a volume which is equivalent to the amount of each of the bleedings 4 are formed at each of the electrode layers 13a and 13b.

Namely, the volume of the recessed portion 14 is set to the value which is equivalent to the amount of bleedings 4 generated from the electrode layers 13a and 13b as a second layer printed on the resistive layer 12 as a first layer.

Accordingly, when the pair of electrode layers 13a and 13b are screen printed on the surfaces of the resistive layer 12 and the insulative base board 11 by utilizing, for example, the screen printing process, the conductive paste of each of the electrode layers 13a and 13b will spread in each of the recessed portion 14, 14— formed in the electrode layers 13a and 13b to form bleedings.

However, almost part of the bleedings is received into the recessed portions 14. Consequently, the recessed portion 14 are almost filled up with the bleedings. Accordingly, the electrode layers 13a and 13b each having a plane and parallel edge portions are obtained, and the electrode layers 13a and 13b are finally formed so as to be close to the original shape having no recessed portions showing in FIG. 5.

For example, in the case of that the distance (d) is about 0.254 mm (0.01 inch), a cutout depth (h) of each of the recessed portions 14 and 14 may be set to about 0.05 mm respectively, and the total amount of the cutout depth is set to about 0.1 mm, so that each of the recessed portions 14 will be filled up with the bleedings generated from the conductive paste of each of the electrode layers 13a and 13b. As the result, both opposite edge surfaces of the electrode layers 13a and 13b become almost parallel with each other, and the distance (d) can be exactly set to a desired value of about 0.254 mm, whereby a predetermined resistance value is secured.

Next, a further embodiment of the method of manufacturing the thick film hybrid circuit board device 40 constructed in the manner described above will be described.

First, an insulative base board made of ceramic such as alumina ($Al_2O_3$) is prepared as a base plate, and at least two kinds of circuit forming materials for forming circuit elements such as resistor, electrode or wirings are prepared in the state of paste which is made enable to flow through the micro holes of the screen during screen printing process.

In this embodiment, a resistive paste containing, for example, ruthenium oxide ($RuO_2$) powder and a conductive paste containing copper (Cu) powder are prepared as circuit forming materials for forming resistors and electrodes respectively. Secondly, the resistive paste is screen printed by utilizing the screen printing process through the screen plate on the insulative base board 11 to form a printed resistive layer in various shapes such as a rectangle. Thirdly, the printed resistive layer is fired at a temperature of 800° to 900° C. or more preferably at about 850° C. under normal atmospheric pressures to form a resistive layer 12 as a first layer.

Fourthly, the conductive paste is screen printed on both right and left (in FIG. 1) edge portions of the resistive layer 12 so as to form a pair of bilateral electrode layers 13a and 13b as a another layer by utilizing the screen printing process.

At the screen printing operation, the recessed portion 14 is formed through a screen plate at each of four cross portions respectively where peripheral edge portion of the resistive layer 12 (corresponding to both upper and lower side portions in FIG. 1) and peripheral edge portions of the electrode layers 13a and 13b are mutually crossed orthogonally. The screen plate for making a circuit pattern in previously constructed so as to form the recessed portions 14 and 14.

However, after the screen printing operation, each of the recessed portions 14 is substantially filled up with the bleedings generated from a pair of electrode layers 13a and 13b consisting of conductive paste, whereby the recessed portions 14 are formed into flat shape.

Then, the printed electrode layers 13a and 13b formed of conductive paste are fired at the temperature of 500° to 700° C. more preferably at about 600° C. in $N_2$ gas atmosphere, for example, to form a pair of bilateral electrode layers 13a and 13b respectively.

According to this embodiment, the distance between the pair of bilateral electrode layers 13a and 13b does not become narrower and is set to a predetermined value, so that the resistance value of the resistive layer 12 can be set precisely to a desired value.

In addition, electrical short circuit which would take place in a pair of electrode layers 13a and 13b caused by the formation of a bridge portion 5 as shown in FIG. 7, which is formed by the bleedings 4 mutually combining are effectively prevented.

Figure 3:
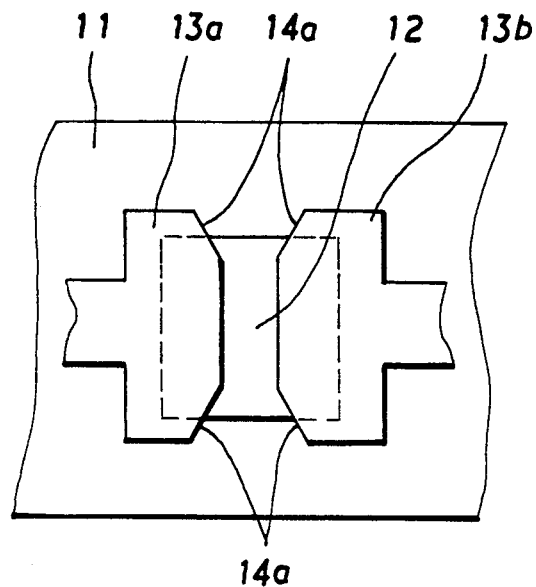
FIGS. 3 and 4 are partial plan views showing two other embodiments of this invention, respectively.

In the embodiment described above in the case where the recessed portion 14 of the pair of bilateral electrode layers 13a and 13b are formed as cutout portions in the shape of a rectangle. However, the present invention is not limited to the described embodiment. For example as shown in FIG. 3, recessed portions 14a may be formed by cutting off the electrode layers 13a and 13b so as to have a shape of a triangle. In this case, as only one straight cutting line extends diagonally is drawn. It therefore becomes easy to design a pattern for making the recessed portion.

Figure 4:
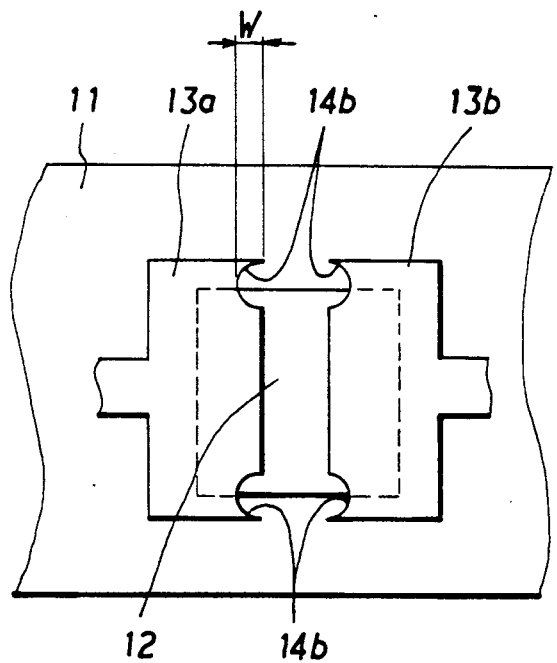

In addition, as shown in FIG. 4, recessed portions 14b may also be formed by cutting off the electrode layers 13a and 13b in the shape of a semi-circle. In this case, each of the electrode layers 13a and 13b is set respectively so as to match an edge portion of the resistive layer 12 with a center line of the semicircle. In other words, each of the electrode layers 13a and 13b is set so as to maximize a length (W) of the edge portion being cut off by the semicircle.

Accordingly, it becomes easy to set a initial locating point of the electrode layers 13a and 13b against the resistive layer 12.

Moreover, in the embodiment described above, the method of manufacturing of circuit board device having a resistive layer 12 as a first layer and having a electrode layers 13a and 13b as a second layer is introduced. However, the present invention is not limited to this embodiment.

The present invention can be generally adapted in the same manner to all kind of this thick film hybrid circuit board device formed by laminating more than three circuit element material layers.

It is to be understood that the present invention is not limited to the preferred embodiment described above and many other modifications and changes may be made without departing from the scope of the appended claims.

What is claimed is:

1. A method of manufacturing a thick film hybrid circuit board device comprising the steps of:

preparing an insulative base board as a base plate;

screen printing one paste-like circuit forming material on a surface of insulative base board to form a first layer;

firing the thus formed first layer;

screen printing another differently composed paste-like circuit forming material on top of at least part of the surface of said first layer and said insulative base board so as to overlap said first layer and said insulative base board in such a manner as to form another layer which has a portion recessed inwardly and located at a cross portion where a peripheral edge portion of said first layer and a peripheral edge portion of the other layer are crossed; and firing the thus formed other layer to form a second layer, thereby said recessed portion being almost filled up with bleedings generated from another paste-like circuit forming material printed on the first layer.

2. A method of manufacturing a thick film hybrid circuit board device according to claim 1, a volume of the recessed portions is set to a value which is substantially equivalent to an amount of bleedings generated from said another layer printed on said first layer.

* * * * *